United States Patent [19]

Mitsumoto et al.

[11] Patent Number: 5,050,127
[45] Date of Patent: * Sep. 17, 1991

[54] MEMORY DEVICE WITH IMPROVED COMMON DATA LINE BIAS ARRANGEMENT

[75] Inventors: Kinya Mitsumoto; Shinji Nakazato, both of Koganei; Yoshiaki Yazawa, Hitachi; Masanori Odaka, Kodaira; Hideaki Uchida, Takasaki; Nobuaki Miyakawa, Ibaraki, all of Japan

[73] Assignee: Hitachi, Ltd., Tokyo, Japan

[*] Notice: The portion of the term of this patent subsequent to May 9, 2006 has been disclaimed.

[21] Appl. No.: 423,947

[22] Filed: Oct. 19, 1989

Related U.S. Application Data

[63] Continuation of Ser. No. 253,181, Oct. 4, 1988, abandoned, which is a continuation of Ser. No. 108,623, Oct. 15, 1987, Pat. No. 4,829,479, which is a continuation of Ser. No. 745,424, Jun. 17, 1985, abandoned.

[30] Foreign Application Priority Data

Jun. 15, 1984 [JP] Japan .................. 59-121820

[51] Int. Cl.$^5$ .......................... G11C 11/413
[52] U.S. Cl. .................. 365/189.09; 365/189.11; 365/190; 365/177; 365/208; 307/530
[58] Field of Search .............. 365/190, 189.05, 189.06, 365/189.11, 189.09, 203, 205, 207, 208, 177; 307/446, 495, 499, 530, 570, 475, 296.7, 296.6

[56] References Cited

U.S. PATENT DOCUMENTS

| | | | |
|---|---|---|---|
| 3,956,661 | 5/1976 | Sakamoto et al. | 307/297 |
| 4,335,449 | 6/1982 | Nokubo | 365/177 |
| 4,430,582 | 2/1984 | Bose et al. | 307/297 |
| 4,507,759 | 3/1985 | Yasui et al. | 365/189.09 |
| 4,616,342 | 10/1986 | Miyamoto | 365/190 |
| 4,658,159 | 4/1987 | Miyamoto | 365/208 |
| 4,665,505 | 5/1987 | Miyakawa et al. | 365/190 |
| 4,713,796 | 12/1987 | Ogiue et al. | 365/177 |
| 4,719,373 | 1/1988 | Masuda et al. | 307/570 |
| 4,829,479 | 5/1989 | Mitsumoto et al. | 365/189.09 |

OTHER PUBLICATIONS

Miyamoto et al., "A 28ns CMOS SRAM With Bipolar Sense Amplifiers", ISSCC Dig. of Tech. Papers, Feb. 23, 1984, pp. 224–225, 344.

*Primary Examiner*—Glenn Gossage
*Attorney, Agent, or Firm*—Antonelli, Terry, Stout & Kraus

[57] ABSTRACT

A memory device wherein a voltage dropped by a fixed voltage from a highest operating voltage is divided using a plurality of impedance elements, and common data lines are biased by the divided voltages. Owing to the application of the voltage dropped by the fixed voltage from the highest operating potential, even when resistance values of the impedance elements are reduced, a current to flow through the impedance element path does not increase considerably, and a low power consumption is attained. Owing to the reduced resistance values of the impedance elements, time constants which are determined by the resistances and stray capacitances parasitic to the common data lines are decreased. Thus, the potential changes of the common data lines to arise in correspondence with information stored in a memory cell are quickened, and a data sense time is curtailed, whereby an access time can be shortened.

20 Claims, 7 Drawing Sheets

MEMORY DEVICE WITH IMPROVED COMMON DATA LINE BIAS ARRANGEMENT

This is a continuation of application Ser. No. 253,181, filed Oct. 4, 1988, now abandoned, which is a continuation of application Ser. No. 108,623, filed 10/15/87, now U.S. Pat. No. 4,829,479, which is a continuation of application Ser. No. 745,424, filed June 17, 1985, now abandoned.

BACKGROUND OF THE INVENTION

This invention relates to a semiconductor memory device, and more particularly to a technology which is effective when applied to a static RAM of large capacity.

As stated in "Nikkei Electronics" published on Sept. 26, 1983, pp. 125-139, static RAMs have increasingly been enlarged in capacity and enhanced in speed. First, the arrangement of a static RAM will be briefly explained.

FIG. 1 shows an example of the whole arrangement of a semiconductor memory device which was developed by the inventors in the course of developing the present invention. The memory device 100 shown in the figure has a memory mat 10 in which a large number of memory cells M are arrayed in the shape of a matrix consisting of rows and columns, an X decoder/driver 20 and a Y decoder 30 which serve to select the memory cell within the memory mat 10 on the basis of address data $A_i$, and so forth.

The X decoder/driver 20 decodes the lower (or upper) bit data of the address data $A_i$, to prepare alternative select signals $X_0$-$X_n$. The select signals $X_0$-$X_n$ are applied to word lines W which are laid in the row direction of the memory mat 10.

The Y decoder 30 decodes the upper (or lower) bit data of the address data $A_i$, to prepare alternative select signals $Y_0$-$Y_n$. The select signals $Y_0$-$Y_n$ are applied to a Y select switch bank (column switch bank) 40. The Y select switch bank 40 operates to select any of complementary data line pairs D and $\overline{D}$, each pair of complementary data lines being laid in the column direction of the memory mat 10.

In the above way, the memory cells M within the memory mat 10 are respectively selected in the row direction and the column direction. The memory cell M, which is connected in the place of intersection between the row and the column selected on the basis of the address data $A_i$, is connected to common data lines $L_1$ and $L_2$ through the selected complementary data line pair D and $\overline{D}$ as well as the Y select switch bank 40. The change of potentials appearing on the common data lines $L_1$ and $L_2$ is detected by a read sense circuit 50, and the detected result becomes the read output $D_{out}$ of stored data. Data $D_{in}$ is written into the memory mat 10 by the data write circuit 55. This data write circuit includes a data input buffer DIB, a data input intermediate amplifier DIIA, MOS transistors $m_1$ and $m_2$ (which elements are shown, for example, in FIG. 9) and a bias circuit 60 (shown in various forms in FIGS. 2, 3, 5, 6, 7 and 9). The data write circuit 55 receives the write enable signals WE($\overline{WE}$) and the chip select signals CS($\overline{CS}$). These signals can be applied to the bias circuit 60 as shown in FIG. 9. The details of connection of these signals to bias circuit 60, as well as details of the data write circuit 55, are omitted from FIGS. 2, 3, 5, 6 and 7 for simplicity.

FIG. 2 shows part of the internal circuitry of the memory device illustrated in FIG. 1, which part has been similarly developed by the inventors in the course of developing the present invention. As shown in the figure, each of the paired complementary data lines D and $\overline{D}$ has one end thereof connected to a common power source $V_{CC}$ through a MOS field effect transistor $m_{11}$ for pull-up and has the other end thereof connected to the common data line $L_1$ or $L_2$ through a Y select switch (column switch) $S_1$ or $S_2$ included in the Y switch bank 40. Accordingly, the stored information written in the selected memory cell M can be read out in such a way that the change of the potentials complementarily appearing on the common data lines $L_1$ and $L_2$ is detected by the read sense circuit 50. The select switches $S_1$ and $S_2$ in the Y select switch bank 40 are respectively constructed using MOS field effect transistors.

The Y select switches $S_1$ and $S_2$ are all rendered OFF (non-conductive) in a non-selected mode, that is, when no valid address data signals are input. At this time, the common data lines $L_1$ and $L_2$ are connected to none of the complementary data line pairs D, $\overline{D}$. On this occasion, there arises the condition that the common data lines $L_1$ and $L_2$ fall into floating states and that their potentials are not fixed.

When the common data lines $L_1$ and $L_2$ are in the floating states in the non-selected mode, charges which have been stored in capacitors parasitic thereto are discharged, and the potentials of these common data lines $L_1$ and $L_2$ are reduced to low potentials (for example, potentials close to the ground potential). Therefore, when any memory cell is subsequently selected to read out information stored therein, a long time is required before the potentials of the common data lines rise up to a level at which the sense circuit for detecting the potential change of the complementary data line pair operates stably. Accordingly, a long access time is involved.

The inventors have therefore provided an arrangement wherein, as illustrated in FIG. 2, a bias circuit 60 is disposed, and the common data lines $L_1$ and $L_2$ are always supplied with fixed potentials (potentials close to those at which the sense circuit operates stably), thereby to shorten the access time.

The bias circuit 60 devised by the inventors as shown in FIG. 2 is such that impedance elements $Z_1$, $Z_2$, $Z_3$ and $Z_4$ formed of MOS field effect transistors are employed for assembling two sets of voltage divider circuits ($Z_1$ and $Z_3$, and $Z_2$ and $Z_4$), and that voltages at respective voltage division points are applied to the common data lines $L_1$ and $L_2$. The two sets of voltage divider circuits ($Z_1$ and $Z_3$, and $Z_2$ and $Z_4$) are respectively connected across the common power source $V_{CC}$ and the ground potential, and they supply the corresponding common data lines $L_1$ and $L_2$ with the voltages obtained through the resistance voltage division of the voltage across the common power source $V_{CC}$ and the ground potential. Thus, the common data lines $L_1$ and $L_2$ are prevented from falling into the electrically floating states and are biased at fixed potentials. The MOS field effect transistors as the impedance elements $Z_1$-$Z_4$ are respectively controlled to turn ON so as to have predetermined equivalent resistances (impedances) by fixed control voltages $V_{S1}$ and $V_{S2}$.

Meanwhile, the inventors have conducted research from the viewpoints of lowering the power consumption and enhancing the operating speed of a static RAM, and, as a result, have developed a technology wherein a static RAM is constructed using both bipolar transistors and MOS transistors. An outline of this technology will now be discussed. In an address circuit, a timing circuit, etc. within a semiconductor memory, an output transistor for charging and discharging a signal line of long distance and an output transistor of large fan-out are formed of bipolar transistors, while logic circuits for executing logic processes, for example, the processes of inversion, non-inversion, NAND and NOR are formed of CMOS circuits. The logic circuit formed of the CMOS circuit is of low power consumption, and the output signal of this logic circuit is transmitted to the signal line of long distance through the bipolar output transistor of low output impedance. Since the output signal is delivered to the signal line by the use of the bipolar output transistor having the low output impedance, the dependence of a signal propagation delay time upon the stray capacitance of the signal line can be lessened, this function realizing the semiconductor memory of low power consumption and high speed.

On the basis of the above technology of the high speed and low power consumption SRAM employing the bipolar-CMOS hybrid technology, the inventors further studied the enhancement of access time. As a result, it has been revealed better for shortening the access time to lower the potential of a common data line and to render the impedance of the common data line (or the amplitude of a signal on the common data line) smaller.

That is, it has been found that when the impedances of the common data lines $L_1$ and $L_2$ are rendered as small as possible, time constants which are determined by capacitances $C_{S1}$ and $C_{S2}$ parasitic to the respective common data lines $L_1$ and $L_2$ and the impedances of these common data lines can be reduced, so the signal transfer speeds of the common data lines can be enhanced.

It has also been found that when the potentials of the common data lines are high, a differential pair of transistors $Q_1$ and $Q_2$ constituting the sense amplifier SA 50 as shown in FIG. 2 come to have high base potentials and become close to saturation because of constant collector voltages. This forms one factor in lowering the signal transfer speeds.

When it is intended as a countermeasure to reduce the impedances of the common data lines and to lower the potentials thereof by the use of the common data line potential generating circuit 60 shown in FIG. 2, the ON resistances of the MOSFETs $Z_1$, $Z_2$, $Z_3$ and $Z_4$ as the impedance elements need to be made small in resistance value. It has been found, however, that when the ON resistances (equivalent impedances) of the MOSFETs $Z_1$-$Z_4$ within the common data line biasing circuit 60 are rendered small for the purpose of lowering the impedances of the common data lines $L_1$ and $L_2$, a through current $I_x$ flowing through the MOSFETs $Z_1$-$Z_4$ in the non-selected mode (i.e. a current flowing in the direction of an arrow in the figure) increases. Therefore, power consumption in this portion attributed to direct current will be increased.

That is, it has been determined by the inventors in studying the arrangement of FIG. 2 which they developed that the contradictory problem occurs in which, when the ON resistances of the MOSFETs within the common data line biasing circuit 60 are reduced for enhancing the operating speed, the power consumption in the non-selected mode increases.

SUMMARY OF THE INVENTION

A typical aspect of performance of the invention disclosed in the present application will be summarized below.

A voltage which is dropped by a fixed voltage from the highest operating potential in a memory device is divided by impedance elements, and common data lines are biased by the divided voltages. By setting the resistances of the impedance elements at small values, time constants which are determined by the resistances and capacitances parasitic to the common data lines are reduced, whereby the potential changes of the common data lines arising in correspondence with the stored information of a memory cell are quickened to shorten a data sensing period of time and to enhance an access time. At the same time, since the voltage dropped by the fixed voltage from the highest operating voltage is applied, direct current to flow through the path of the impedance elements does not considerably increase in spite of the small resistance values of these impedance elements. Therefore, a decrease in power consumption can be achieved.

DESCRIPTION OF THE PREFERRED EMBODIMENTS

Figure 1:
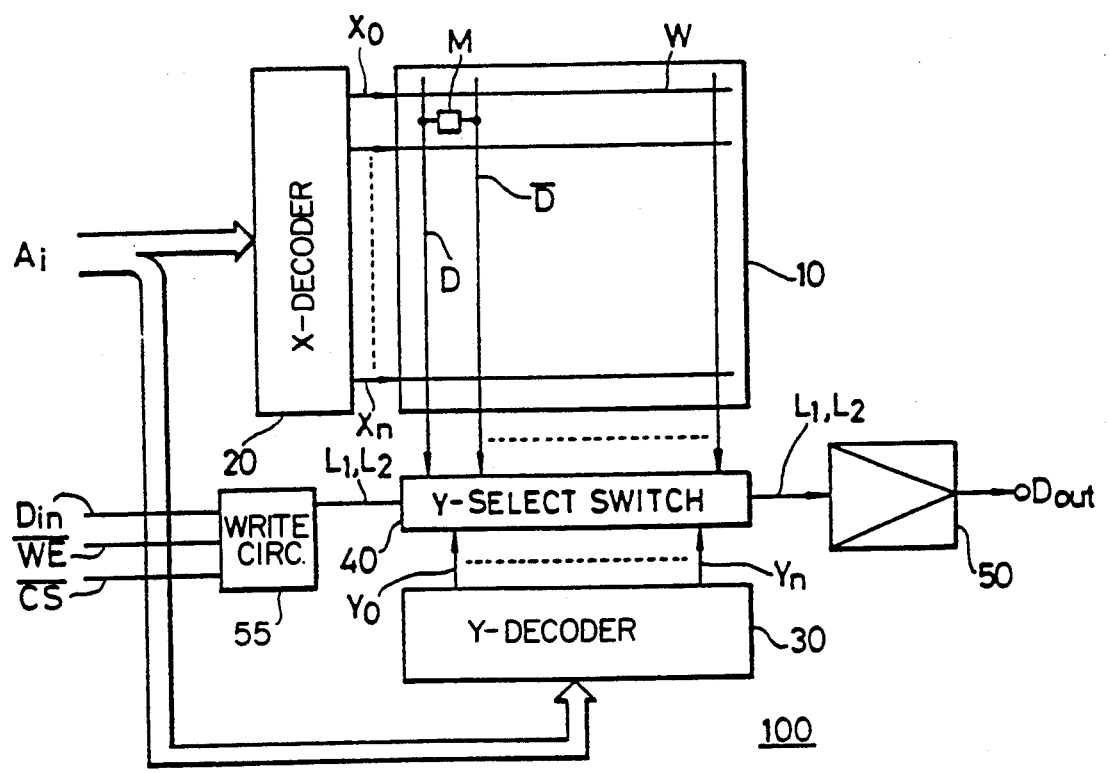
FIG. 1 is a diagram showing an example of the whole arrangement of a memory device which was studied by the inventors in developing the present invention.
Figure 2:
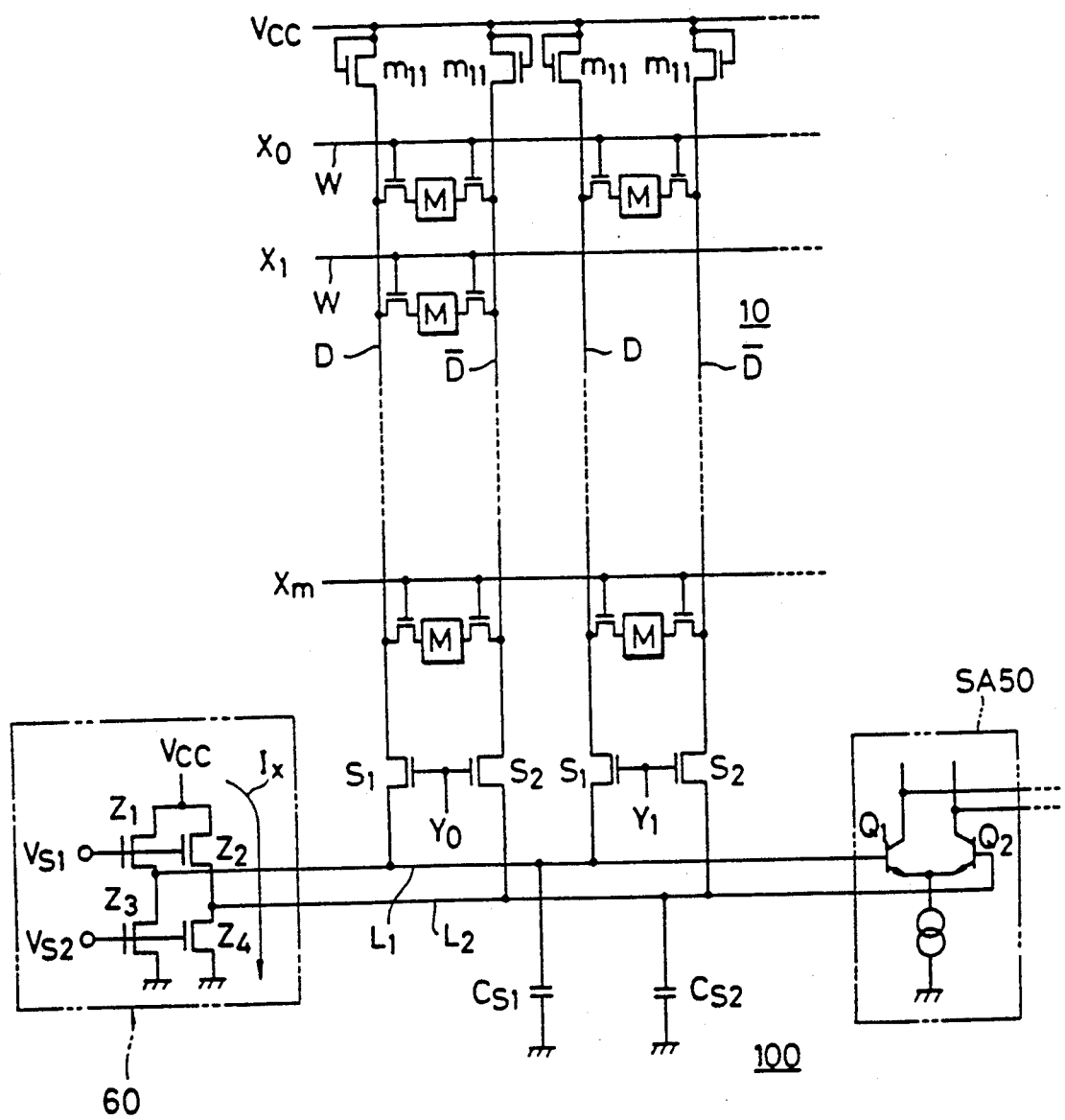
FIG. 2 is a circuit diagram showing part of the memory device depicted in FIG. 1 in accordance with development work done by the inventors.

An object of this invention is to provide a memory device which enhances an access speed while suppressing an increase in power consumption.

The aforementioned and other objects and novel features of this invention will become apparent from the description of the specification and the accompanying drawings.

Now, typical embodiments of this invention will be described with reference to the drawings.

In the drawings, the same symbols indicate identical or corresponding portions.

As noted previously, FIG. 1 shows an example of the whole arrangement of a semiconductor memory device to which this invention is applied. The memory device 100 shown in the figure is constructed, as previously discussed, as a semiconductor integrated circuit of the so-called Bi/C-MOS type, which has been developed by the inventors, in which C-MOS elements and bipolar elements are formed coexistently. As also noted previously, it constructs a static RAM in point of function. This semiconductor memory device 100 has a memory mat 10 in which a large number of memory cells M are arrayed in the shape of a matrix consisting of rows and columns, an X decoder/driver 20 and a Y decoder 30 which serve to select the memory cell within the memory mat 10 on the basis of address data $A_i$, and so forth.

The X decoder/driver 20 decodes the lower (or upper) bit data of the address data $A_i$, to prepare alternative select signals $X_0$-$X_n$. The select signals $X_0$-$X_n$ are applied to word lines W which are laid in the row direction of the memory mat 10.

The Y decoder 30 decodes the upper (or lower) bit data of the address data $A_i$, to prepare alternative select signals $Y_0$-$Y_n$. The select signals $Y_0$-$Y_n$ are applied to a Y select switch bank (column switch bank) 40. The Y select switch bank 40 operates to select any of complementary data line pairs D and $\overline{D}$, each pair of complementary data lines being laid in the column direction of the memory mat 10. This selection is performed simultaneously with the selection of the word line W.

In the above way, the memory cells M within the memory mat 10 are respectively selected in the row direction and the column direction. The memory cell M, which is connected in the place of intersection between the row and the column selected on the basis of the address data $A_i$, is connected to common data lines $L_1$ and $L_2$ through the complementary data line pair D and $\overline{D}$ as well as the Y select switch bank 40. The change of potentials appearing on the common data lines $L_1$ and $L_2$ is detected by a sense circuit 50, and the detected result becomes the read output $D_{out}$ of stored data.

Figure 3:
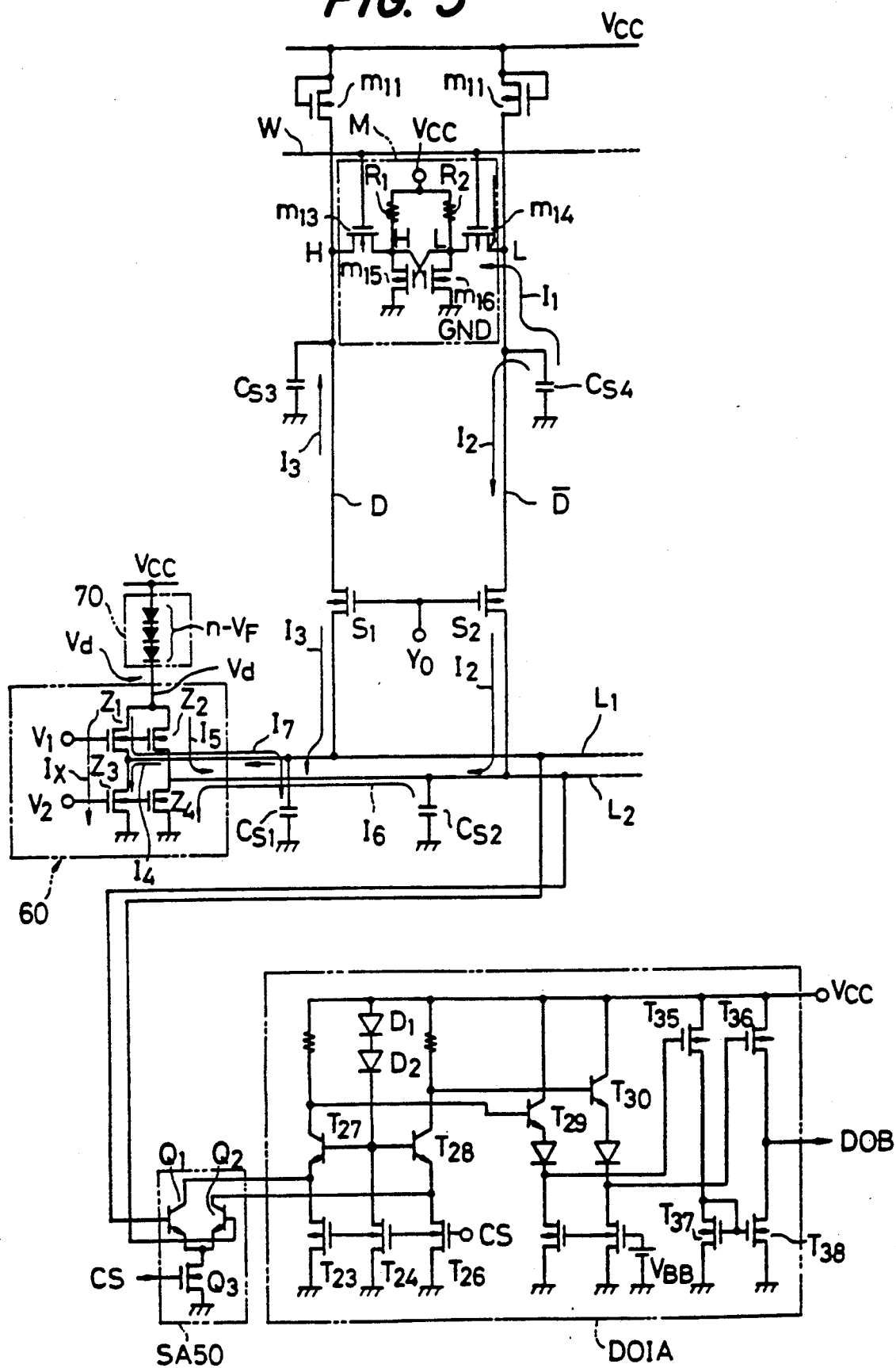
FIG. 3 is a diagram showing part of FIG. 1 in accordance with one embodiment of this invention.

FIG. 3 shows part of the internal circuitry of the memory device illustrated in FIG. 1 in accordance with the first embodiment of the present invention. As shown in the figure, the memory cells M are respectively connected to the pair of complementary data lines D and $\overline{D}$ of each column through MOS field effect transistors $m_{13}$ and $m_{14}$. The MOS field effect transistors $m_{13}$, $m_{14}$ interposed between the memory cell M and the data lines D, $\overline{D}$ are turned ON (conductive) in the row direction by the selected word line W, while at the same time the data lines D, $\overline{D}$ of any column are selected, whereby the memory cell M located in the place of intersection between the selected word line W and the selected data lines D, $\overline{D}$ is selected and is connected to the common data lines $L_1$, $L_2$. Each of the data lines D and $\overline{D}$ has one end thereof connected to a common power source $V_{CC}$ through a MOS field effect transistor for pull-up $m_{11}$ and has the other end thereof connected to the common data line $L_1$ or $L_2$ through a Y select switch (column switch) $S_1$ or $S_2$ included in the Y switch bank 40. Accordingly, stored information written in the selected memory cell M can be read out in such a way that the change of the potentials complementarily appearing on the common data lines $L_1$ and $L_2$ is detected by the sense circuit SA 50. The select switches $S_1$ and $S_2$ in the Y select switch bank are respectively constructed using MOS field effect transistors.

Meanwhile, in order to avoid the condition that the common data lines $L_1$ and $L_2$ fall into floating states and do not have their potentials fixed in a non-selected mode, a bias circuit 60 is provided for applying fixed potentials to the common data lines $L_1$ and $L_2$. The bias circuit 60 is so arranged that impedance elements $Z_1$, $Z_2$, $Z_3$ and $Z_4$ formed of MOS field effect transistors are employed for assembling two sets of voltage divider circuits ($Z_1$ and $Z_3$, and $Z_2$ and $Z_4$), and that voltages at respective voltage division points are applied to the common data lines $L_1$ and $L_2$.

Here, the two sets of voltage divider circuits (bias circuit) ($Z_1$ and $Z_3$, and $Z_2$ and $Z_4$) are connected across the common power source $V_{CC}$ and the ground potential with a voltage regulator circuit (also termed "constant voltage generator circuit" or "voltage drop generator circuit") 70 interposed in series therebetween. In this embodiment, the voltage regulator circuit 70 is constructed of a diode train $D_n$ in which a plurality of diodes are connected in series in the forward direction. Thus, a power source $V_d$ having a fixed voltage lower than that of the common power source $V_{CC}$ is provided. The lower source voltage $V_d$ is applied to the respective voltage divider circuits ($Z_1$ and $Z_3$, and $Z_2$ and $Z_4$). Accordingly, the common data lines $L_1$ and $L_2$ are biased to fixed potentials by the voltages produced through the resistance division of the lower source voltage $V_d$.

The MOS field effect transistors as the impedance elements $Z_1$-$Z_4$ are respectively controlled to turn ON so as to have predetermined equivalent resistances (impedances) by fixed control voltages $V_{S1}$ and $V_{S2}$.

The voltage divider circuits ($Z_1$ and $Z_3$, and $Z_2$ and $Z_4$) in the bias circuit 60 are fed with the voltage $V_d$ which is dropped by a fixed voltage level from the supply voltage.

The potential $V_{ref}$ of the common data lines $L_1$ and $L_2$ at the time at which the column switches $S_1$ and $S_2$ are not selected, becomes:

$$V_{ref} = (V_{CC} - n \cdot V_f) \cdot \frac{R_3}{R_1 + R_3}$$

$$(\text{or } V_{ref} = (V_{CC} - n \cdot V_f) \cdot \frac{R_4}{R_2 + R_4}$$

where $R_1$, $R_2$, $R_3$ and $R_4$ denote the ON resistances of the MOS field effect transistors $Z_1$, $Z_2$, $Z_3$ and $Z_4$ as the impedance elements respectively.

On the other hand, the common data lines $L_1$ and $L_2$ are respectively connected to the bases of a differential pair of transistors $Q_1$ and $Q_2$ which constitute the sense amplifier SA 50. The minimum base potential $V_b$ of the transistors $Q_1$ and $Q_2$ required for these transistors to stably turn ON is:

$$V_b = V_{be} + V_{ds}$$

where $V_{ds}$ denotes the source-drain voltage of a MOS field effect transistor $Q_3$ which operates as a constant current source for the differential transistors $Q_1$ and $Q_2$, and $V_{be}$ the base-emitter voltage of the transistors $Q_1$ and $Q_2$.

Therefore, in order to bring the sense amplifier SA 50 into a stable operation state at high speed in the data reading mode, the common data line potential $V_{ref}$ in the stand-by mode is set at a value which is lower than $V_b$ by a certain voltage $\beta$.

Figure 4:
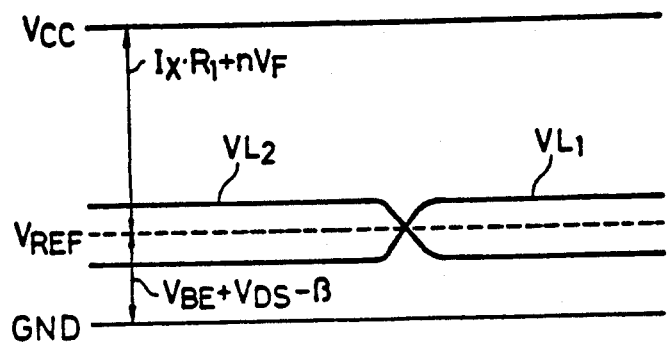
FIG. 4 is a diagram showing an example of the characteristic of the memory device according to the first embodiment of this invention shown in FIG. 3.

That is, $V_{ref} = V_{be} + V_{ds} - \beta$ is set. The bias voltages which are applied to the bases of the transistors $Q_1$ and $Q_2$ are the minimum required potential, with which the transistor $Q_1$ or $Q_2$ is not saturated, and the output dynamic ranges of grounded-base transistors $T_{27}$ and $T_{28}$ which constitute the first amplifier stage of a data output intermediate amplifier DOIA do not narrow, either. Thus, the collector bias on transistors $Q_1$ and $Q_2$ from the transistors $T_{27}$ and $T_{28}$ and the base bias on transistors $Q_1$ and $Q_2$ from the bias circuit 60 operate to prevent saturation of the transistors $Q_1$ and $Q_2$. The above explanation is illustrated in FIG. 4 as the potential switching characteristic of the common data lines $L_1$ and $L_2$.

Next, let's consider a case where the column switches $S_1$ and $S_2$ are turned ON by the Y select signal $Y_0$ so as to read out the data stored in the memory cell. In this case, the H (high) and L (low) information items of the data stored in the memory cell cause the potential changes of the complementary data line pair D, $\overline{D}$ and the potential changes of the common data line pair $L_1$, $L_2$ and are then input to the sense amplifier SA 50. The situation of signal transfer on this occasion is depicted in the form of current changes in FIG. 3. While the actual signal transfer mechanism is affected by various factors and cannot be simply elucidated, FIG. 3 shall show the rough sketch thereof which will be briefly explained below.

Assuming now that an n-channel MOS field effect transistor $m_{15}$ and MOS field effect transistor $m_{16}$ which constitute the memory cell (flip-flop circuit) are in an OFF state and an ON state, respectively, the drain of the MOS field effect transistor $m_{15}$ is at the "H" level, and that of the MOS field effect transistor $m_{16}$ is at the "L" level. These potentials are respectively transmitted to the pair of complementary data lines D and $\overline{D}$ through the MOS field effect transistors $m_{13}$ and $m_{14}$, to render the data line D the "H" level and the data line $\overline{D}$ the "L" level.

Then, as regards the data line $\overline{D}$, charges stored through the precharging MOSFET $m_{11}$ in a parasitic capacitance $C_{S4}$ parasitic to this data line $\overline{D}$ are discharged to cause currents $I_1$ and $I_2$ to flow.

As regards the data line D, a current $I_3$ flows through the precharging MOSFET $m_{11}$.

Next, the common data lines $L_1$ and $L_2$ will be considered. As regards the common data line $L_2$, charges having been stored in a capacitance $C_{S2}$ parasitic thereto are discharged principally through the MOSFET $Z_4$ (current $I_6$), so that the potential of the common data line $L_2$ becomes the low level.

On the other hand, as regards the common data line $L_1$, a capacitance $C_{S1}$ parasitic thereto is charged with part of the current $I_3$ and with a current $I_7$ fed through the MOSFET $Z_1$, so that the potential of the common data line $L_1$ becomes the "H" level. The MOSFETs $Z_1$, $Z_2$, $Z_3$ and $Z_4$ participate in the charge and discharge of the parasitic capacitances $C_{S1}$ and $C_{S2}$ parasitic to the common data lines as briefly stated above, and the time constants which are determined by the equivalent resistances of the MOSFETs $Z_1$-$Z_4$ and the parasitic capacitances $C_{S1}$, $C_{S2}$ exert influences on the potential change speeds of the common data lines. As described before, therefore, the equivalent resistances of the MOSFETs $Z_1$-$Z_4$ are set at the comparatively low values, owing to which the potential change speeds of the common data lines are raised. The inventors' study has revealed that the access time shortens when the equivalent resistances $R_1$, $R_2$, $R_3$ and $R_4$ of the respective MOSFETs $Z_1$, $Z_2$, $Z_3$ and $Z_4$ are set to be $R_1$, $R_2 < R_3$, $R_4$.

Noteworthy here is that, even when the ON resistances of the MOSFETs $Z_1$-$Z_4$ are lowered to some extent as described above, the voltage $V_d$ lowered by the certain voltage from the supply voltage $V_{CC}$ is provided from the voltage regulator circuit 70 and is applied to the drains of the MOSFETs $Z_1$ and $Z_2$, whereby the magnitudes of through currents (direct currents) which flow through the MOSFETs $Z_1$, $Z_3$ and those $Z_2$, $Z_4$ in the non-selected mode can be made small.

As thus far stated, the common data line potential is lowered and the equivalent impedances of the common data lines $L_1$, $L_2$ are reduced without causing any great through current or steady current to flow, so that the operating speed can be enhanced whilst suppressing the power consumption. That is, the time constants dependent upon the parasitic capacitances near the common data lines $L_1$, $L_2$ decrease owing to the lowered impedances of these common data lines $L_1$, $L_2$, whereby the enhancement of the operating speed can be achieved.

FIG. 4 shows the situation of potential change-over in the common data lines $L_1$ and $L_2$.

Figure 5:
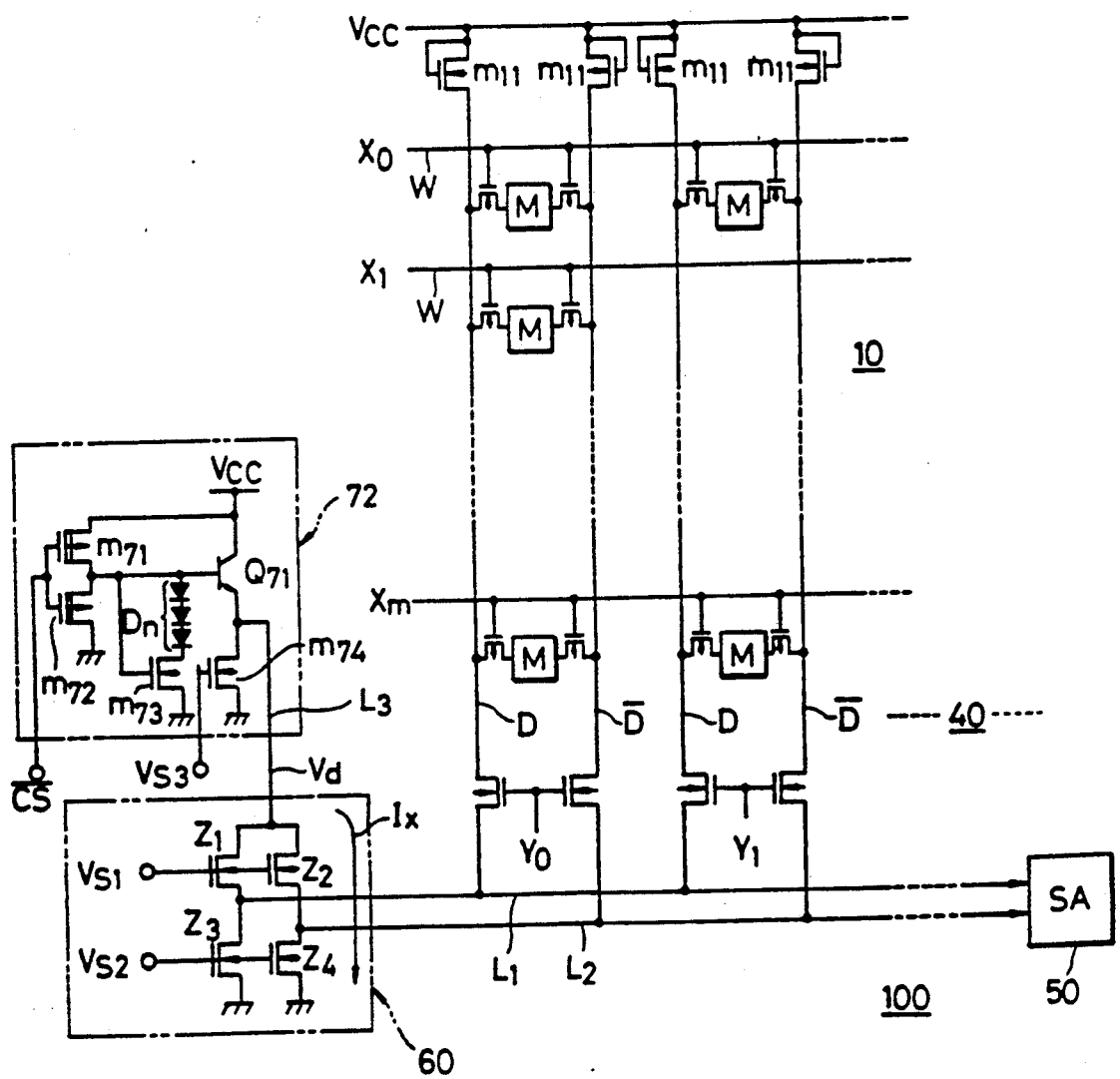
FIG. 5 is a circuit diagram of essential portions showing a second embodiment of this invention.

FIG. 5 shows a second embodiment in the essential portions of the memory device according to this invention.

The embodiment shown in FIG. 5 is basically the same as the foregoing embodiment of FIG. 3. Herein, however, the output stage of a constant voltage generator circuit which serves to produce the lower source voltage $V_d$ for operating the bias circuit 60 is provided with an emitter follower so as to realize a low output impedance.

When the output impedance of the constant voltage generator circuit 72 is lowered in this manner, an output voltage signal can be reliably fed to the bias circuit 60 even if a signal transmission line $L_3$ coupling the constant voltage generator circuit and the bias circuit becomes long. As a result, in designing the layout of an IC, it is also possible to arrange the constant voltage generator circuit 72 by itself in a convenient place independently, and to transmit the output voltage thereof to the common data line biasing circuit 60 by means of Al wiring or the like. This enhances versatility in the layout design.

Moreover, in an arrangement in which the memory cells and the common data lines are divided into several groups, the divided groups of common data lines can share the single constant voltage generator circuit 72. This is useful for reducing a chip area.

The constant voltage generator circuit 72 is constructed using the emitter follower stage which is composed of a bipolar transistor $Q_{71}$ and a MOS field effect transistor $m_{74}$. The MOS field effect transistor $m_{74}$ in this case functions as a load impedance. This load impedance is set sufficiently higher than that of the impedance elements $Z_1$-$Z_4$ in order to prevent a consumption current in the emitter follower stage from increasing. Besides, MOS field effect transistors $m_{71}$, $m_{72}$ and $m_{73}$ and a diode train $D_n$ are used for applying a reference voltage to the emitter follower stage.

Here, when a fixed current is fed to the diode train $D_n$ by the conduction of the MOS field effect transistors $m_{71}$, $m_{72}$ and $m_{73}$, a fixed voltage develops across both the ends of the diode train $D_n$. This fixed voltage is input to the base of the bipolar transistor $Q_{71}$, the emitter of which responsively provides the power source $V_d$ of low impedance output. The voltage of the output power source $V_d$ is set sufficiently lower than that of the common power source $V_{CC}$ by adjusting the number of the diodes of the diode train $D_n$, etc., whereby the bias circuit 60 composed of the impedance elements $Z_1$-$Z_4$ can be furnished with the power source $V_d$ of low voltage and low impedance. Thus, the same effect as in the foregoing embodiment can be attained.

Further, in the embodiment shown in FIG. 5, the MOS field effect transistors $m_{71}$, $m_{72}$ for causing the fixed current to flow through the diode train $D_n$ and the MOS field effect transistor $m_{74}$ as the load resistance of the bipolar transistor $Q_{71}$ are respectively controlled by external signals including, for example, a chip select signal $\overline{CS}$. This can realize an arrangement wherein, in the stand-by mode (with $\overline{CS}$ being "H") by way of example, the MOS field effect transistors $m_{71}$, $m_{72}$ and $m_{74}$ are brought into OFF states so as to automatically turn OFF the operating power source $V_d$ of the bias circuit 60. Thus, it is permitted to automatically save power consumption during, for example, any mode other than the reading operation or the non-selected mode.

Figure 6:
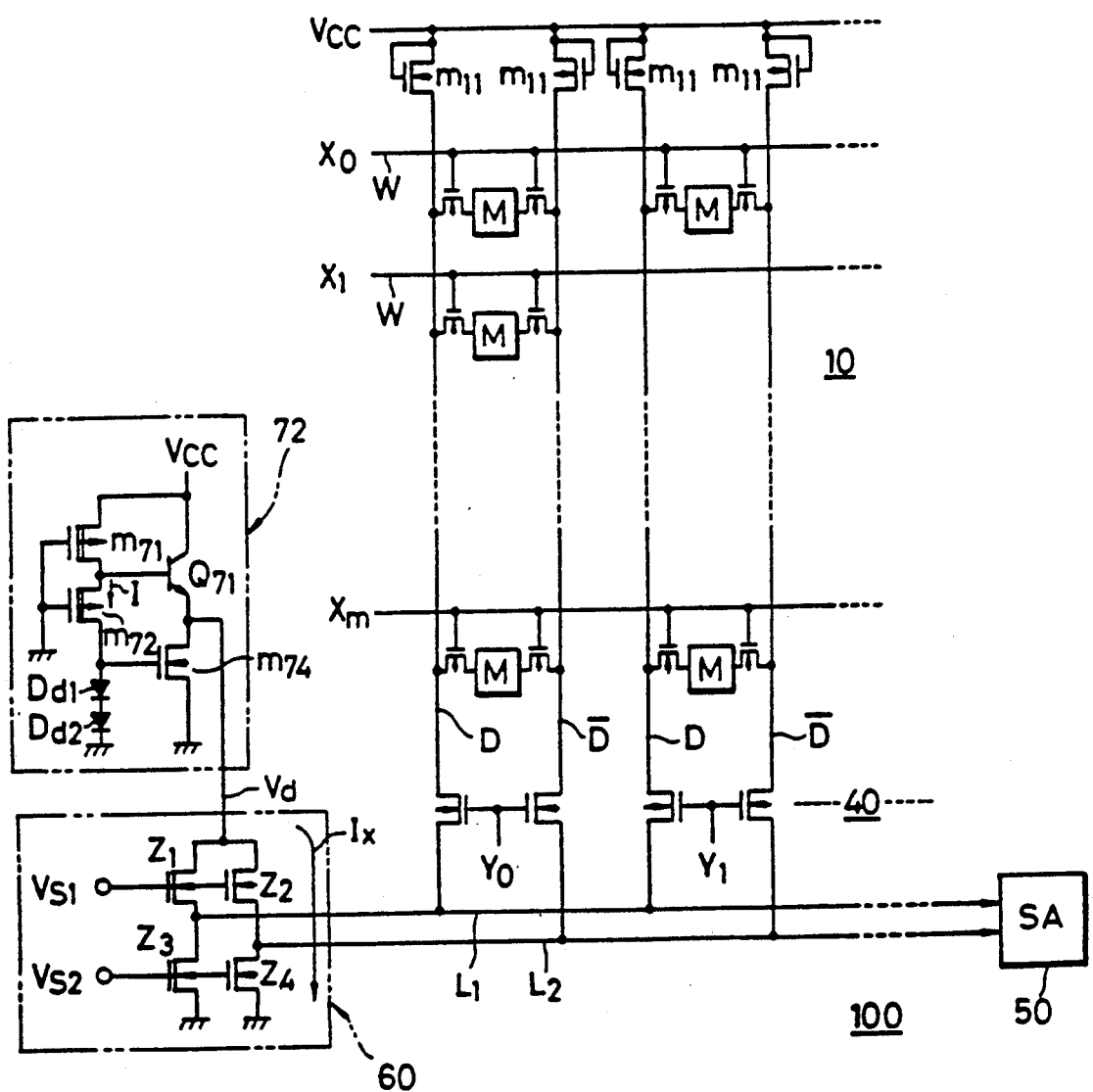
FIG. 6 is a circuit diagram of essential portions showing a third embodiment of this invention.

FIG. 6 shows a third embodiment in the essential portions of the memory device according to this invention.

Likewise to the embodiment shown in FIG. 5, the embodiment shown in FIG. 6 is also provided with a constant voltage generator circuit 72 based on an emitter follower in order to afford the power source $V_d$ of low voltage and low output impedance for operating the bias circuit 60.

This constant voltage generator circuit 72 is constructed using the emitter follower stage which is composed of a bipolar transistor $Q_{71}$ and a MOS field effect transistor $m_{74}$. The MOS field effect transistor $m_{74}$ in this case functions as a load impedance, and acts to stabilize the potential. In addition, p-channel depletion-mode MOS field effect transistors $m_{71}$ and $m_{72}$ and fixed voltage generating diodes $D_{d1}$ and $D_{d2}$ are used for applying a reference voltage to the emitter follower stage.

Here, when a fixed current I flows through the diodes $D_{d1}$ and $D_{d2}$ via the depletion-mode MOS field effect transistors $m_{71}$ and $m_{72}$, the emitter of the bipolar transistor $Q_{71}$ produces the voltage $V_d$ which is determined by $V_{CC}$-$I\cdot R_{71}$-$V_{BEQ71}$ (where $R_{71}$ denotes the ON resistance of the MOSFET $m_{71}$, and $V_{BEQ71}$ the base-emitter voltage of the transistor $Q_{71}$) and which is of low impedance output. By setting the output voltage $V_d$ to be lower than the voltage of the common power source $V_{CC}$, the bias circuit 60 composed of the impedance elements $Z_1$-$Z_4$ can be furnished with the power source $V_d$ of low voltage and low impedance. Thus, the same effect as in the foregoing embodiments can be attained.

Further, in the embodiment shown in FIG. 6, the diodes $D_{d1}$ and $D_{d2}$ function to compensate the temperature dependence of the base-emitter voltage of the transistor $Q_{71}$ and prevent the output voltage $V_d$ from fluctuating in correspondence with a temperature change. In consequence, the output voltage ($V_d$) is stabilized against temperatures. Thus, the bias potentials of the common data lines $L_1$ and $L_2$ can be more stabilized. This makes it possible to perform stable and reliable read-out sensing even when, by way of example, the amplitudes of signal voltages on the common data lines $L_1$ and $L_2$ are sharply reduced.

Figure 7:
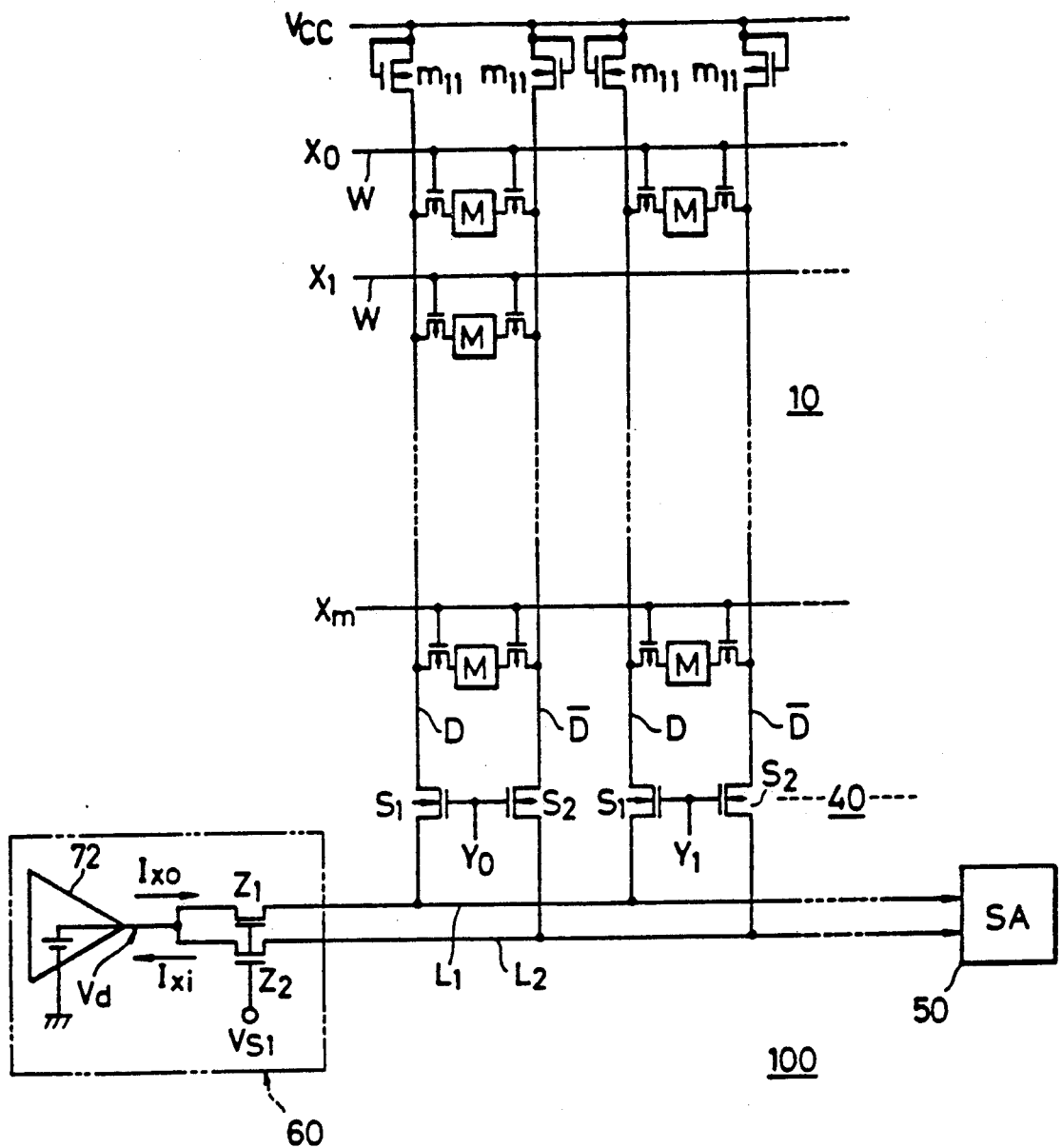
FIG. 7 is a circuit diagram of essential portions showing a fourth embodiment of this invention.

FIG. 7 shows a fourth embodiment in the essential portions of the memory device according to this invention.

Unlike the preceding embodiments, the embodiment shown in the figure has a bias circuit 60 constructed without employing a resistance voltage divider circuit. Here, the output of a constant voltage generator circuit 72 of low voltage and low impedance output as left intact is applied to the common data lines $L_1$ and $L_2$ through impedance elements $Z_1$ and $Z_2$ respectively. In this case, the constant voltage generator circuit 72 is constructed of an active circuit which simulates an ideal battery. That is, the constant voltage generator circuit 72 is used which has no directivity in impedance, namely, which has a bidirectional output characteristic wherein a fixed low impedance is exhibited in both a case where an outflow current (discharge current $I_{xo}$ flows and a case where an inflow current (absorption current $I_{xi}$ flows.

Figure 8:
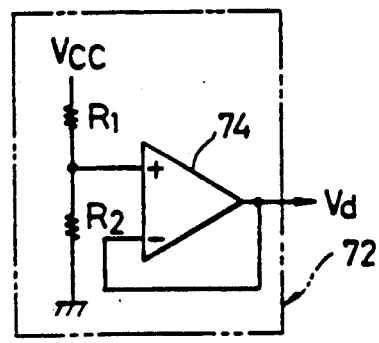
FIG. 8 is a diagram showing part of the circuit depicted in FIG. 7.

FIG. 8 shows an example of the constant voltage generator circuit 72 which has the bidirectional output characteristic. The constant voltage generator circuit 72 shown in the figure constructs an active circuit of the so-called voltage follower type by the use of a differential type high gain D.C. amplifier circuit 74. A very high equivalent impedance is attained on the input side of this active circuit, and a very low equivalent impedance on the output side thereof. Accordingly, when a voltage obtained by dividing the voltage of the common power source $V_{CC}$ by means of high resistances $R_1$ and $R_2$ is input, a D.C. output which is substantially the same voltage as this input voltage is produced with a low output impedance. Thus, the common data lines $L_1$ and $L_2$ can be biased into low impedance states without causing a great steady current or through current to flow. Moreover, the bias potential can be set as desired in accordance with the ratio between the high resistances $R_1$ and $R_2$. This makes it possible to bias the common data lines $L_1$ and $L_2$ into states which are the most suitable for high speed reading and stable operations.

In this embodiment, the output voltage ($V_d$) of the constant voltage generator circuit 72 is set sufficiently lower than the voltage of the common power source $V_{CC}$. Concretely, it is set at a voltage which can ensure a potential difference capable of rendering sufficiently low the ON (conduction) resistances of the MOS field effect transistors that are used as the Y select switches $S_1$, $S_2$ between the data lines D, $\overline{D}$ and the common data lines $L_1$, $L_2$.

Figure 9:
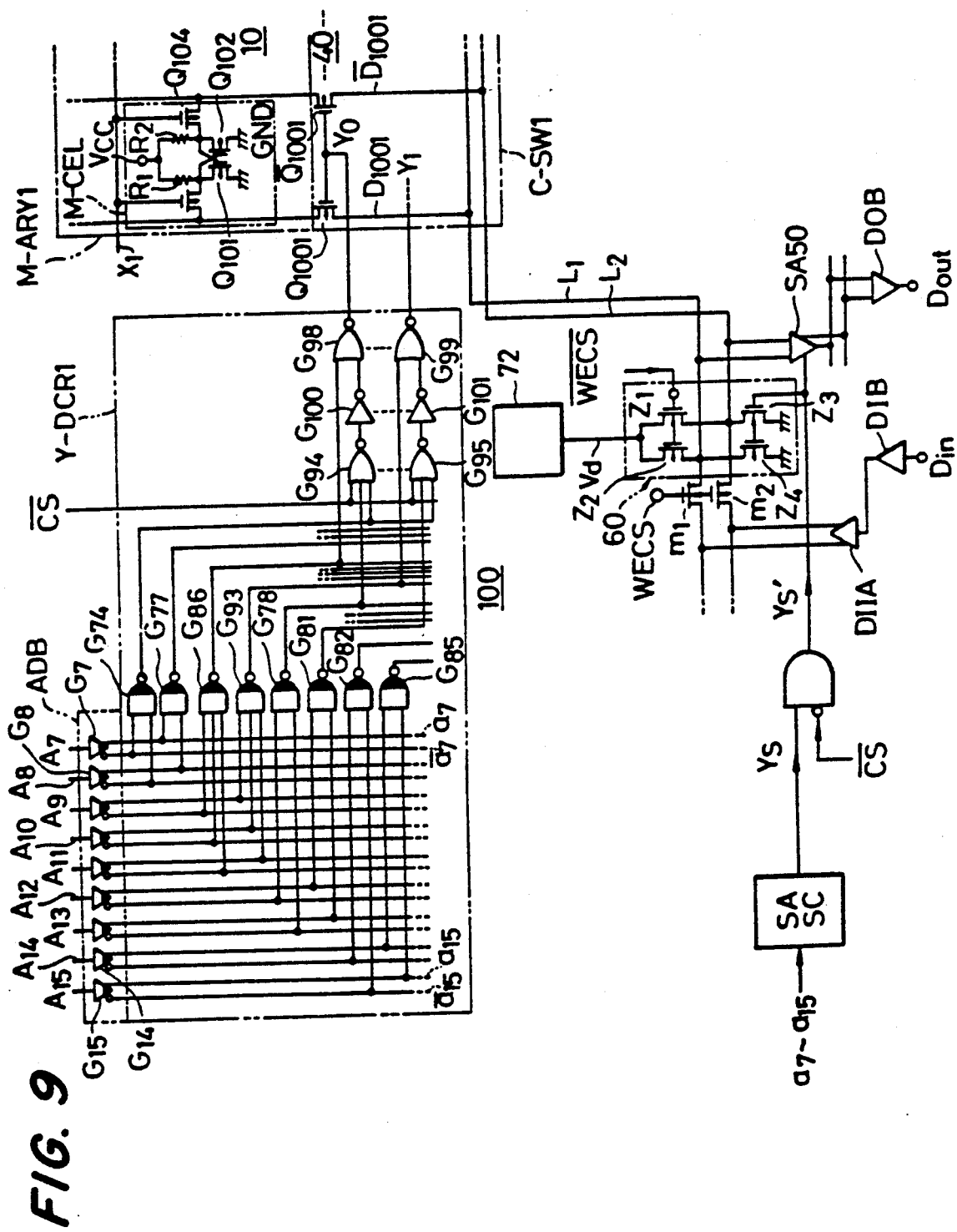
FIG. 9 is a circuit diagram of essential portions showing another embodiment of this invention.

FIG. 9 shows a static memory device of 64 kilobits according to this invention.

The embodiment shown in the figure is so constructed that stored information written in a selected memory cell M-CEL is read out through common data lines $L_1$, $L_2$ and a read-out sensing circuit SA 50, and that the common data lines $L_1$, $L_2$ and the read-out sensing circuits SA 50 are dividedly disposed in a plurality of groups. In this 64 k-bit RAM, the common data lines $L_1$, $L_2$ and the read-out sensing circuits 50 are provided in a manner to be divided into 16 groups, any of which is selected and activated. In FIG. 9, those logic symbols which have the output side marked in black represent quasi-CMOS circuits in which an output transistor for charging and discharging the stray capacitance of an output signal line is formed of a bipolar transistor and in which logic processing such as inversion, non-inversion, NAND or NOR is executed by a CMOS circuit. On the other hand, ordinary logic symbols represent pure CMOS circuits. As illustrated in FIG. 9, in an address buffer ADB, there are arranged non-inverting and inverting circuits $G_7$-$G_{15}$ whose inputs receive address signals $A_7$-$A_{15}$ of TTL levels from outside by way of example and which serve to deliver non-inverted outputs $a_7$-$a_{15}$ and inverted outputs $\overline{a}_7$-$\overline{a}_{15}$ to complementary output signal lines. The output transistors of the non-inverting and inverting circuits $G_7-G_{15}$ are formed of the bipolar transistors as stated above, so that even when the output signal lines of the non-inverting and inverting circuits $G_7-G_{15}$ are arranged over a long distance on the surface of a semiconductor chip, these non-inverting and inverting circuits $G_7-G_{15}$ can be operated at high speed.

Next, a Y decoder Y-DCR1 will be briefly explained.

It includes 2-input NAND circuits $G_{74}-G_{77}$, $G_{78}-G_{81}$ and $G_{82}-G_{85}$ and 3-input NAND circuits $G_{86}-G_{93}$ to which the internal address signals $a_7-a_{15}$ and $\overline{a_7}-\overline{a_{15}}$ provided from the address buffer ADB are applied.

Further, in the Y decoder Y-DCR1, the output signal lines of the NAND circuits $G_{74}-G_{93}$ are arranged at long distances and are connected to the input terminals of a large number of NOR circuits $G_{94}-G_{95}$, so that the stray capacitances of the output signal lines of these NAND circuits $G_{74}-G_{93}$ become large capacitance values.

Accordingly, the 3-input NAND circuits $G_{86}-G_{93}$ are constructed of quasi-CMOS 3-input NAND circuits whose output transistors are bipolar, while the 2-input NAND circuits $G_{74}-G_{85}$ are constructed of quasi-CMOS 2-input NAND circuits whose output transistors are bipolar.

On the other hand, in FIG. 9, the output signal lines of the 3-input NOR circuits $G_{94}-G_{95}$ are connected to the inputs of inverters $G_{100}-G_{101}$ at a short distance, so that the stray capacitances of the output signal lines of these 3-input NOR circuits $G_{94}-G_{95}$ have small capacitance values. Accordingly, these 3-input NOR circuits $G_{94}-G_{95}$ are constructed of pure CMOS 3-input NOR circuits.

Further, since the output signal lines of the inverters $G_{100}-G_{101}$ are connected to the input terminals of 2-input NOR circuits $G_{98}-G_{99}$ at a short distance, the capacitance values of the stray capacitances of the output signal lines of these inverters $G_{100}-G_{101}$ are small. Accordingly, these inverters $G_{100}-G_{101}$ are constructed of well-known pure CMOS inverters.

An explanation will now be given of the construction of one of the memory cells M-CEL which is used to store 1 bit in a memory array M-ARY which stores a large number of bits. As shown in FIG. 9, this memory cell M-CEL is constructed of a flip-flop in which the inputs and outputs of a pair of inverters composed of load resistances $R_1$, $R_2$ and n-channel MISFETs $Q_{101}$, $Q_{102}$ are cross-connected. N-channel MISFETs $Q_{103}$, $Q_{104}$ are used for transfer gates.

The flip-flop is used as a means for storing information. The transfer gates are controlled by an address signal which is applied to a word line $X_1$ connected to an X decoder (row decoder), and the information transfer between a complementary data line pair $D_{1001}$, $\overline{D}_{1001}$ and the flip-flop is controlled by these transfer gates.

In the reading operation, MOS field effect transistors $m_1$ and $m_2$ are brought into OFF states by a write enable control signal WECS, and the information stored in the memory cell is read out through a data output buffer DOB as well as the read-out sense circuit SA 50 which is activated by a read-out sense circuit select signal $Y_S$ generated from a read-out sense circuit selecting circuit SASC (and a chip select signal $\overline{CS}$).

In the writing operation, the MOS field effect transistors $m_1$ and $m_2$ are brought into ON states, whereas the read-out sense circuit SA 50 is brought into an OFF state by a read-out sense circuit select signal $Y_S'$. Thus, input data is written into a predetermined memory cell through a data input buffer DIB and a data input intermediate amplifier circuit DIIA.

According to the embodiment shown in FIG. 9, the memory device 100 of the above arrangement is characterized in that only the common data lines $L_1$, $L_2$ connected to the read-out sense circuit 50 of the selected group are selectively fed with voltages for biasing these data lines to a fixed potential. Concretely, the bias circuit 60 is provided for the common data lines $L_1$ and $L_2$ and read-out sense circuit 50 of each group. Simultaneously therewith, the select signal $Y_S$ of the read-out sense circuit 50 is branched, and the branched signal is used as the control signal of the bias circuit 60. Only ground side impedance elements $Z_3$, $Z_4$ within the bias circuit 60 corresponding to the selected read-out sense circuit 50 are brought into ON states, and all the other ground side impedance elements within the bias circuits 60 corresponding to the non-selected read-out sense circuits (not shown) are brought into OFF states. In this way, a current for biasing the common data lines $L_1$, $L_2$ can be reduced down to about 1/16 in the case of the aforementioned 64 k-bit RAM by way of example. Further, the select signal $Y_S$ of the read-out sense circuit has its logical product taken with the chip select signal CS. On this occasion, the current for biasing the common data lines $L_1$, $L_2$ is permitted to scarcely flow in the stand-by mode during which the chip select signal CS is inactive. Thus, according to this embodiment, the average power consumption of the memory device 100 can be reduced.

A constant voltage generator circuit 72 for applying a low voltage $V_d$ to the bias circuit 60 has its output rendered a low impedance output utilizing a voltage follower, whereby the stray capacitances and other parasitic impedances of signal transfer lines can be neglected, and only one constant voltage generator circuit 72 disposed in the IC can be exploited in common.

The effects of the present invention thus far described will be summed up below.

(1) In a memory device which is so constructed that stored information written in a selected memory cell is read out through common data lines, the equivalent impedances of the common data lines can be sharply reduced without causing a great through current or steady current to flow. This achieves the effect that an operating speed can be enhanced without considerably increasing power consumption.

(2) The memory device is so constructed that stored information written in a selected memory cell is read out through common data lines and a read-out sense circuit and that the common data lines and the read-out sense circuits are dividedly disposed in a plurality of groups. The readout sense circuit of one of the plurality of groups is selected and activated. Only the common data lines connected to the read-out sense circuit of the selected group are selectively fed with voltages for biasing these data lines to a fixed potential. Therefore, a current for biasing the common data lines can be considerably lessened. This achieves the effect that the average power consumption of the entire memory device can be increased.

While, in the above, the invention made by the inventors has been concretely described in conjunction with embodiments, it is needless to say that this invention is not restricted to the foregoing embodiments but that it can be variously modified within a scope not departing from the subject matter thereof. For example, bipolar transistors may well be employed for the impedance elements $Z_1$-$Z_4$ within the bias circuit 60.

While, in the above, the invention made by the inventors has been chiefly explained as to the case of application to a static RAM which forms the background field of utilization thereof, it is not restricted thereto but is also applicable to a ROM or a dynamic RAM, by way of example. The invention is applicable to any device including at least the condition that stored information is read out through common data lines.

We claim:

1. A memory device comprising:
   a first terminal to which a first power supply voltage is applied;
   a second terminal to which a second power supply voltage is applied, the first power supply voltage being greater than the second power supply voltage;
   memory cell means for storing data therein;
   differential bipolar transistors having their bases coupled to receive a pair of signals based on the data stored in the memory cell means, their emitters coupled in common to form a common emitter, and their collectors coupled to provide output signals in response to the pair of signals;
   a first MOSFET for providing an operating current for the differential bipolar transistors, the first MOSFET having a source-drain path coupled between the common emitter of the differential bipolar transistors and the second terminal, the first MOSFET being selectively turned on to read out the data stored in the memory cell means by using the differential bipolar transistors;
   base bias means coupled between the first and second terminals for biasing the bases of the differential bipolar transistors at a third voltage, the third voltage being between the first and second power supply voltages; and
   collector bias means coupled between the first and second terminals for providing a fourth voltage to the collectors of the differential bipolar transistors, the fourth voltage being between the first and second power supply voltages and being equal to or greater than the third voltage,
   wherein the base and collector bias means prevent the differential bipolar transistors from operating in a saturation region, and
   wherein said base bias means includes a pair of second MOSFETs having their source-drain paths coupled between the second terminal and the respective bases of the differential bipolar transistors and their gates coupled to a gate of the first MOSFET so that the first MOSFET and the pair of second MOSFETs are simultaneously turned on, said base bias means further including a first level shift circuit which is coupled between said first terminal and the respective bases of the differential bipolar transistors and which has at least one bipolar transistor and diode elements.

2. A memory device according to claim 1, wherein the memory cell means includes a static type memory cell having a flip-flop.

3. A memory device according to claim 1, wherein the memory cell means is a static type memory cell comprised of resistance elements and N channel MOSFETs whose gates and drains are cross-coupled to each other.

4. A memory device according to claim 1, further comprising:
   control means coupled to the gates of the first MOSFET and the pair of second MOSFETs for selectively turning on the first MOSFET and the pair of second MOSFETs by providing an activation signal to the gates of the first MOSFET and the pair of second MOSFETs.

5. A memory device according to claim 1, wherein said collector bias means includes a pair of bipolar transistors having emitters coupled to the collectors of the differential bipolar transistors, respectively, and a second level shift circuit coupled between the first terminal and bases of the pair of bipolar transistors, wherein collectors of the pair of bipolar transistors are coupled to the first terminal via load elements, respectively.

6. A memory device according to claim 5, wherein the second level shift circuit includes a diode element.

7. A memory device according to claim 5, wherein the first MOSFET and the pair of second MOSFETs are all of an N channel type.

8. A memory device according to claim 5, the collector bias means further includes first and second current providing elements coupled between the respective emitters of the pair of bipolar transistors and the second terminal, and a third current providing element coupled between the bases of the pair of bipolar transistors and the second terminal.

9. A semiconductor memory device comprising:
   a first terminal for supplying a first supply voltage;
   a second terminal for supplying a second supply voltage lower than the first supply voltage;
   a plurality of word lines;
   a pair of data lines;
   a plurality of memory cells each storing data therein and coupled to the plurality of word lines and to the pair of data lines so that each memory cell is coupled to one word line, the memory cells each including a pair of driver MOSFETs whose gates and drains are cross-coupled to one another and whose sources are coupled to the second terminal, and resistance elements of polycrystalline silicon coupled between the respective drains of the pair of driver MOSFETs and the first terminal, a pair of transfer MOSFETs whose gates are coupled to a corresponding word line and whose respective source-drain paths are coupled between the corresponding drains of the pair of driver MOSFETs and the corresponding data lines;
   selecting means coupled to the plurality of word lines and responsive to a selecting signal for selecting a specific memory cell from the plurality of memory cells by selecting a specific word line, so that voltages on the pair of data lines are changed in accordance with the data stored in the specific memory cell which is coupled to the specific word line;
   a pair of differentially connected bipolar transistors having their bases coupled to respond to the voltages on the pair of data lines, their emitters coupled in common to form a common emitter and their collectors coupled to provide a pair of output signals in accordance with the voltages on the pair of data lines;
   current providing means coupled between the common emitter of the differentially connected bipolar transistors and the second terminal for providing an operating current of the differentially connected bipolar transistors;

base bias means coupled between the first and second terminals for biasing the bases of the differentially connected bipolar transistors at a first predetermined voltage between the first and second supply voltages, and including level shift elements comprised of at least one diode and at least one MOSFET which are coupled in series between the first and second terminals; and output means coupled to the collectors of the differentially connected bipolar transistors and responsive to the pair of output signals for providing an output in accordance with the pair of output signals, and including a collector bias circuit coupled between the first and second terminals for biasing the collectors of the differentially connected bipolar transistors at a second predetermined voltage between the first supply voltage and the first predetermined voltage, wherein the base bias circuit further includes at least one bipolar transistor serving as a level shift element.

10. A semiconductor memory device according to claim 9, wherein the current providing means includes an N channel MOSFET having a source-drain path coupled between the common emitter of the differentially connected bipolar transistors and the second terminal and having a gate coupled to receive an activation signal, and wherein the base bias circuit further includes N channel MOSFETs having their source-drain paths coupled between the bases of the differentially connected bipolar transistors and the second terminal, respectively, and their gates coupled to receive the activation signal.

11. A semiconductor memory device according to claim 10, further comprising:
means coupled to the gate of the N channel MOSFET in the current providing means and to the gates of the N channel MOSFETs in the base bias circuit for selectively providing the activation signal in response to a selection signal.

12. A semiconductor memory device according to claim 9, wherein the collector bias circuit includes a pair of bipolar transistors having their emitters respectively coupled to the collectors of the differentially connected bipolar transistors, and level shift means coupled between the first terminal and bases of the pair of bipolar transistors in the collector bias circuit.

13. A semiconductor memory device according to claim 12, wherein the level shift means in the collector bias circuit includes a plurality of diode elements.

14. A semiconductor memory device according to claim 12, wherein said output means further includes:
load elements coupled between the respective collectors of the pair of bipolar transistors in the collector bias circuit and the first terminal; and
first current providing elements coupled between the respective emitters of the pair of bipolar transistors in the collector bias circuit and the second terminal,
wherein the collector bias circuit further includes a second current providing element coupled between the bases of the pair of bipolar transistors in the collector bias circuit and the second terminal.

15. A semiconductor memory device comprising:
a first terminal to which a first power supply voltage is supplied;
a second terminal to which a second power supply voltage is supplied;
a plurality of memory cells;
selecting means for selecting a specific memory cell out of said plurality of memory cells;
a sensing bipolar transistor having a base coupled to receive a signal based on data stored in the specific memory cell and having a collector coupled to provide an output according to the signal;
a first N channel MOSFET having a source-drain path coupled between an emitter of the sensing bipolar transistor and the second terminal and for providing an operating current for the sensing bipolar transistor when an activation signal is received at a gate of the first MOSFET;
a base bias circuit, coupled to the base of the sensing bipolar transistor, for biasing the base of the sensing bipolar transistor at a first predetermined voltage, the base bias circuit including a first bipolar transistor having a collector thereof coupled to the first terminal and having an emitter thereof coupled to the base of the sensing bipolar transistor via a level shift transistor, a P channel MOSFET having a source-drain path thereof coupled between the first terminal and the base of the first bipolar transistor and a gate thereof coupled to the second terminal, and a second N channel MOSFET having a source-drain path coupled between the base of the sensing bipolar transistor and the second terminal and having a gate coupled to the gate of the first N channel MOSFET to receive the activation signal, wherein the first predetermined voltage is between the first and second power supply voltages; and
output means, coupled to the collector of the sensing bipolar transistor, for providing an output in response to the output supplied from the sensing bipolar transistor, the output means including a collector bias circuit for biasing the collector of the sensing bipolar transistor at a second predetermined voltage between the first predetermined voltage and the first power supply voltage, the collector bias circuit including a bipolar transistor having an emitter coupled to the collector of the sensing bipolar transistor, a collector coupled to the first terminal via a load element and a base coupled to the first terminal via a level shift circuit.

16. A semiconductor memory device according to claim 15, wherein the sensing bipolar transistor, the bipolar transistor in the base bias circuit and the bipolar transistor in the collector bias circuit are of an NPN type.

17. A semiconductor memory device according to claim 15, wherein the plurality of memory cells are static type memory cells each including a flip-flop.

18. A semiconductor memory device according to claim 15, wherein the level shift circuit includes a plurality of diode elements.

19. A semiconductor memory device according to claim 18, wherein the output means further includes a first current providing element coupled between the base of the bipolar transistor in the collector bias circuit and the second terminal, and a second current providing element coupled between the emitter of the bipolar transistor in the collector bias circuit and the second terminal.

20. A semiconductor memory device according to claim 15, further comprising:
a control circuit coupled to the gates of the first and second N channel MOSFETs for selectively providing the activation signal.

* * * * *